(12) United States Patent
Sehmer et al.

(10) Patent No.: US 9,979,095 B2
(45) Date of Patent: May 22, 2018

(54) RADIO FREQUENCY IDENTIFICATION TECHNIQUES IN AN ULTRA-LOW TEMPERATURE ENVIRONMENT

(71) Applicant: PROMEGA CORPORATION, Madison, WI (US)

(72) Inventors: Mark Sehmer, Stoughton, WI (US); Brian George, Brodhead, WI (US); Joe Pleshek, Cambridge, WI (US); Travis Phillips, Stoughton, WI (US)

(73) Assignee: PROMEGA CORPORATION, Madison, WI (US)

( * ) Notice: Subject to any disclaimer, the term of this patent is extended or adjusted under 35 U.S.C. 154(b) by 47 days.

(21) Appl. No.: 15/040,068

(22) Filed: Feb. 10, 2016

(65) Prior Publication Data

US 2016/0232386 A1    Aug. 11, 2016

Related U.S. Application Data

(60) Provisional application No. 62/114,805, filed on Feb. 11, 2015.

(51) Int. Cl.
*G06K 7/10*     (2006.01)
*H01Q 21/28*    (2006.01)
(Continued)

(52) U.S. Cl.
CPC ......... *H01Q 21/28* (2013.01); *G06K 7/10316* (2013.01); *H01Q 1/2216* (2013.01);
(Continued)

(58) Field of Classification Search
CPC ............... G06K 7/10336; G06K 17/00; G06K 2017/0045; G06K 2017/0051;
(Continued)

(56) References Cited

U.S. PATENT DOCUMENTS

2002/0183882 A1* 12/2002 Dearing ............. G06K 7/10336
                                                                  700/115
2007/0016852 A1    1/2007 Kim
(Continued)

OTHER PUBLICATIONS

PCT, Notification of Transmittal of the International Search Report and the Written Opinion of the International Searching Authority, or the Declaration, in Application No. PCT/US16/17125, dated May 26, 2016 (15 pages).
(Continued)

*Primary Examiner* — Dionne H Pendleton
(74) *Attorney, Agent, or Firm* — McAndrews, Held & Malloy, Ltd.

(57) ABSTRACT

According to certain inventive techniques, a system includes a plurality of shelves in an interior chamber of a cold-storage apparatus, an RFID antenna assembly in the cold-storage apparatus, and a controller. Each of the shelves can support items that are connected a corresponding RFID tag. The RFID antenna assembly includes a plurality of RFID antenna elements that direct a transmission of radio frequenc(ies) towards the plurality of shelves. The controller is in communication with the RFID antenna assembly and can individually and separately control each of the RFID antenna elements.

17 Claims, 6 Drawing Sheets

(51) Int. Cl.
*H05K 1/18* (2006.01)
*H01Q 9/04* (2006.01)
*H01Q 1/22* (2006.01)
*H01Q 21/06* (2006.01)

(52) U.S. Cl.
CPC ......... *H01Q 9/0407* (2013.01); *H01Q 9/0414* (2013.01); *H01Q 21/065* (2013.01); *H05K 1/181* (2013.01)

(58) Field of Classification Search
CPC ......... G06K 2017/0074; G06K 7/0008; G06K 7/10009; G06K 7/10158; G06K 7/10178; G06K 7/10316; G06K 7/10346; G08B 13/2462; H04W 4/02; H01Q 1/2216; H01Q 21/065; H01Q 21/28; H01Q 1/243; H01Q 1/38; H01Q 3/2676; H01Q 9/0414; H01Q 9/0457; H01Q 9/0407; H04N 5/2257; H05K 1/0215; H05K 1/189; H05K 2201/0281; H05K 2201/10409
See application file for complete search history.

(56) References Cited

U.S. PATENT DOCUMENTS

| | | | |
|---|---|---|---|
| 2010/0259454 A1 | 10/2010 | Rahola | |
| 2010/0328037 A1* | 12/2010 | Thomas | F25D 29/00 340/10.1 |
| 2012/0056719 A1* | 3/2012 | Krishna | G06K 7/10316 340/10.1 |
| 2012/0276311 A1* | 11/2012 | Chirila | H01Q 1/2208 428/34.1 |
| 2013/0009839 A1 | 1/2013 | Nghiem | |
| 2013/0162407 A1* | 6/2013 | Moore | G06K 7/10336 340/10.1 |
| 2014/0316561 A1 | 10/2014 | Tkachenko | |
| 2017/0110796 A1* | 4/2017 | Rokhsaz | H01Q 7/005 |
| 2017/0367190 A1* | 12/2017 | Drzaic | G09G 3/20 |

OTHER PUBLICATIONS

PCT, Notification Concerning Transmittal of International Preliminary Report on Patentability (Chapter I of the Patent Cooperation, in Application No. PCT/US2016/017125, dated Aug. 24, 2017 (13 pages).

* cited by examiner

RADIO FREQUENCY IDENTIFICATION TECHNIQUES IN AN ULTRA-LOW TEMPERATURE ENVIRONMENT

CROSS REFERENCE TO RELATED APPLICATIONS

This application claims the benefit of U.S. Provisional Patent Ser. No. 62/114,805, filed on Feb. 11, 2015, the entirety of which is herein incorporated by reference.

FEDERALLY SPONSORED RESEARCH OR DEVELOPMENT

[Not Applicable]

JOINT RESEARCH AGREEMENT

[Not Applicable]

SEQUENCE LISTING

[Not Applicable]

BACKGROUND

Generally, the present application relates to radio-frequency identification ("RFID") techniques in an ultra-low temperature ("ULT") environment.

A ULT cold-storage device may store items (for example, vials that include temperature sensitive samples) at a temperature such as approximately −80° C. This temperature may be used for preventing degradation long-term or provide substantially indefinite storage of temperature sensitive items (for example, biological samples stored in vials).

A ULT cold-storage device may be able to hold a relatively large number of items that are in containers (for example, approximately 20,000 1 µl vials). Due to such significant storage capacity, it may be desirable to track inventory of items by maintaining a log of the given samples in a given ULT freezer.

One conventional way to track inventory employs attaching or connecting an RFID tag to stored items and/or containers (for simplicity, the term "item" encompasses the term "container" herein unless specifically indicated otherwise). As the items are placed in or removed from the ULT cold-storage device, the tags on the items can be scanned with an RFID reader to electronically identify the items outside of the ULT cold-storage device. Before items are added to the ULT cold-storage device, a given item's RFID tag can be read and the inventory list contained in the ULT cold-storage device can be updated (or alternatively, initially generated) by adding the item's information to the list. Similarly, as items are removed from the ULT cold-storage device, the RFID tag can be read, and the inventory list can be updated (or alternatively, initially generated), by removing the item's information from the list. This technique, however, requires a user in a labor intensive manner to perform a manual RFID reading step every time an inventoried item is added or removed from the ULT cold-storage device. Failure of the user to perform this RFID reading step can cause errors in the inventory list for the ULT cold-storage device. Further, by the user performing the scan and update steps repeatedly, miscommunications, miscues and other problems regularly occur causing significant inventory control errors, greater difficulty in inventory logistical planning, increased delays in inventory restocking, among others.

Another way to track RFID-tagged items is to have one or more RFID reader antennas in the ULT cold-storage device. However, due to accuracy limitations, known cold-storage devices do not have the ability to accurately detect RFID-tagged items stored within a given container.

Consequently, it is desirable to have a cold-storage apparatus that can detect a relatively high density of RFID-tagged items (including, for example, RFID-tagged items stored in a container) in a ULT environment. Moreover, it would also be desirable to have a cold-storage apparatus that can detect a relatively high density of RFID-tagged items in a ULT environment using an antenna designed to function efficiently at ULT temperature ranges. The antenna may also provide enough RF signal to have the ability to read all RFID tags on a given shelf. Additionally, it would also be desirable to have a cold-storage apparatus that does not require any or extensive user intervention for its operation to, for example, to assess the inventory within while in a ULT environment.

SUMMARY

According to certain inventive techniques, the present technology provides at least one system that includes a plurality of shelves in an interior chamber of a cold-storage apparatus, at least one RFID antenna assembly in the cold-storage apparatus, and at least one controller. The cold-storage apparatus can store inventory at a temperature between approximately −70° C. to approximately −90° C. (for example, approximately −80° C.). Each of the shelves can support one or more items that are attached to a corresponding RFID tag. The RFID antenna assembly can include a plurality of RFID antenna elements (for example, approximately six antenna elements) that can each individually direct a transmission of radio frequenc(ies) towards the shelves. For example, the RFID antenna assembly can be located above the shelves (among other positions), and the transmission of radio frequenc(ies) may be directed downward. The antenna elements may be circularly polarized. Further, the controller can be in communication with the RFID antenna assembly and can individually and separately control each of the RFID antenna elements. For example, the controller may activate only one of the RFID antenna elements at a time. However, it should be appreciated by those skilled in the art that alternative configurations are also envisioned.

The antenna elements of the present technology may be formed on, for example, two printed circuit boards. Each antenna element may include a patterned conductive layer, ground plane, a patch, and a dielectric region in between the ground plane and the patch. The dielectric region may include, for example, a dielectric constant foam with a relatively low dielectric constant (e.g., a foam having a dielectric constant of approximately about 1.00 to about 1.10 and preferably about 1.03). The dielectric region may also include a first layer of glass-reinforced epoxy laminate interposed between the ground plane and the low dielectric constant foam and may also include a second layer of glass-reinforced epoxy laminate interposed between the patch and the low dielectric constant foam.

In some aspects and embodiments, the system of the present technology may also include one or more mechanical tuning structures that allow a user to tune the RFID antenna elements (for example, at an ULT operating temperature). The system may also include at least one processing system that receives data regarding scanned RFID tags (placed on or in a sufficient manner attached to the plurality of items) from the controller.

According to certain inventive techniques, the one or more systems of the present technology can include at least one RFID antenna assembly for use in a cold-storage apparatus and at least one controller in communication with the RFID antenna assembly. The RFID antenna assembly may be optimized to operate at temperatures between approximately −70° C. to approximately −90° C. (for example, approximately −80° C.). The RFID antenna assembly of the present technology is configured to scan a plurality of RFID tags on a corresponding plurality of stored items. The RFID antenna assembly can include a plurality of individual RFID antenna elements. The elements may be circularly polarized. The controller can individually and separately control each of the plurality of individual RFID antenna elements, for example, in a configurable fashion. The controller can also activate only one of the plurality of individual RFID antenna elements at a time, if desired.

The antenna elements may be formed on, for example, two printed circuit boards. Each antenna element may include a patterned conductive layer, a ground plane, a patch, and a dielectric region in between the ground plane and the patch. The dielectric region may include at least one dielectric constant foam with a low dielectric constant (for example, a foam having a dielectric constant of approximately about 1.00 to about 1.10, and preferably about 1.03). The dielectric region may also include a first layer of glass-reinforced epoxy laminate interposed between the ground plane and the low dielectric constant foam, and may also include a second layer of glass-reinforced epoxy laminate interposed between the patch and the low dielectric constant foam.

The one or more systems of the present technology may also include one or more mechanical tuning structures that allow at least one user to tune the RFID antenna elements. The system may also include at least one processing system that receives data regarding scanned RFID tags (placed, for example, on or attached to the plurality of items) from the controller.

The systems of the present technology may be similar to those described above and may include a plurality of RFID antenna assemblies.

Figure 1A:
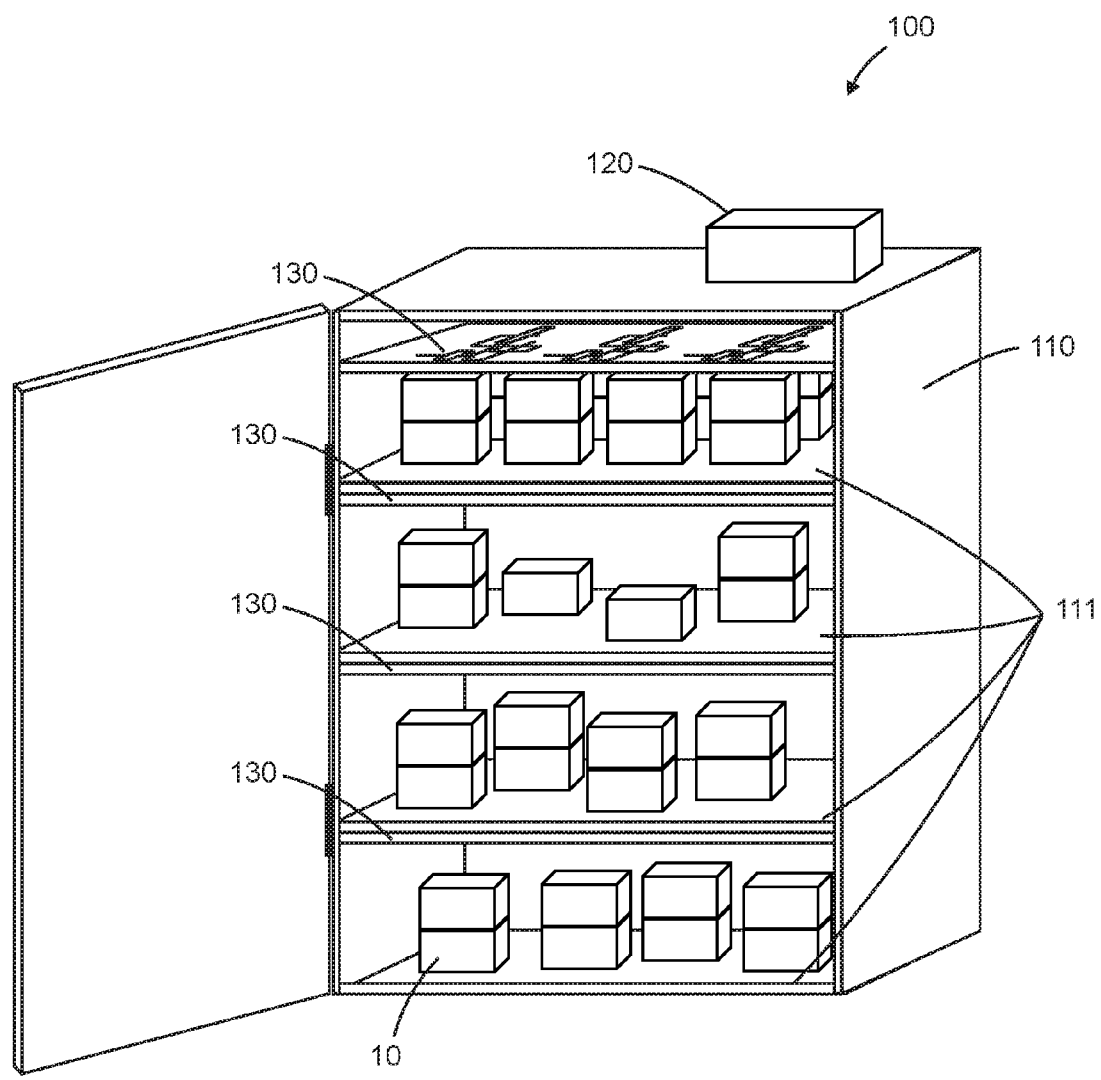
FIG. 1A illustrates a system including a cold-storage apparatus, a controller, and an RFID antenna assembly, according to certain inventive techniques.

The foregoing summary, as well as the following detailed description of certain techniques of the present application, will be better understood when read in conjunction with the appended drawings. For the purposes of illustration, certain techniques are shown in the drawings. It should be understood, however, that the claims are not limited to the arrangements and instrumentality shown in the attached drawings.

DETAILED DESCRIPTION

FIG. 1A illustrates a system 100 including a cold-storage apparatus 110, a controller 120, and a plurality of RFID antenna assemblies 130, according to certain inventive techniques of the present technology. The cold-storage apparatus 110 may include one or more shelves 111 in an interior region of the apparatus 110. The cold-storage apparatus 110 may store the items 10 at a temperature between approximately about −70° C. to about −90° C. (for example, approximately about −80° C.). The shelves 111 are capable of supporting items 10 (which, again, may be one or more containers that store other items), one or more of which may be attached to an RFID tag. An RFID tag may also include information identifying (for example, uniquely identifying) the item(s) 10 to which it is attached. The RFID tags (e.g., EPC, TIC, SN, LOT tags) may be attached to item(s) 10 using a ULT-grade adhesive to prevent tags from separating from the item(s) 10.

Figure 2A:
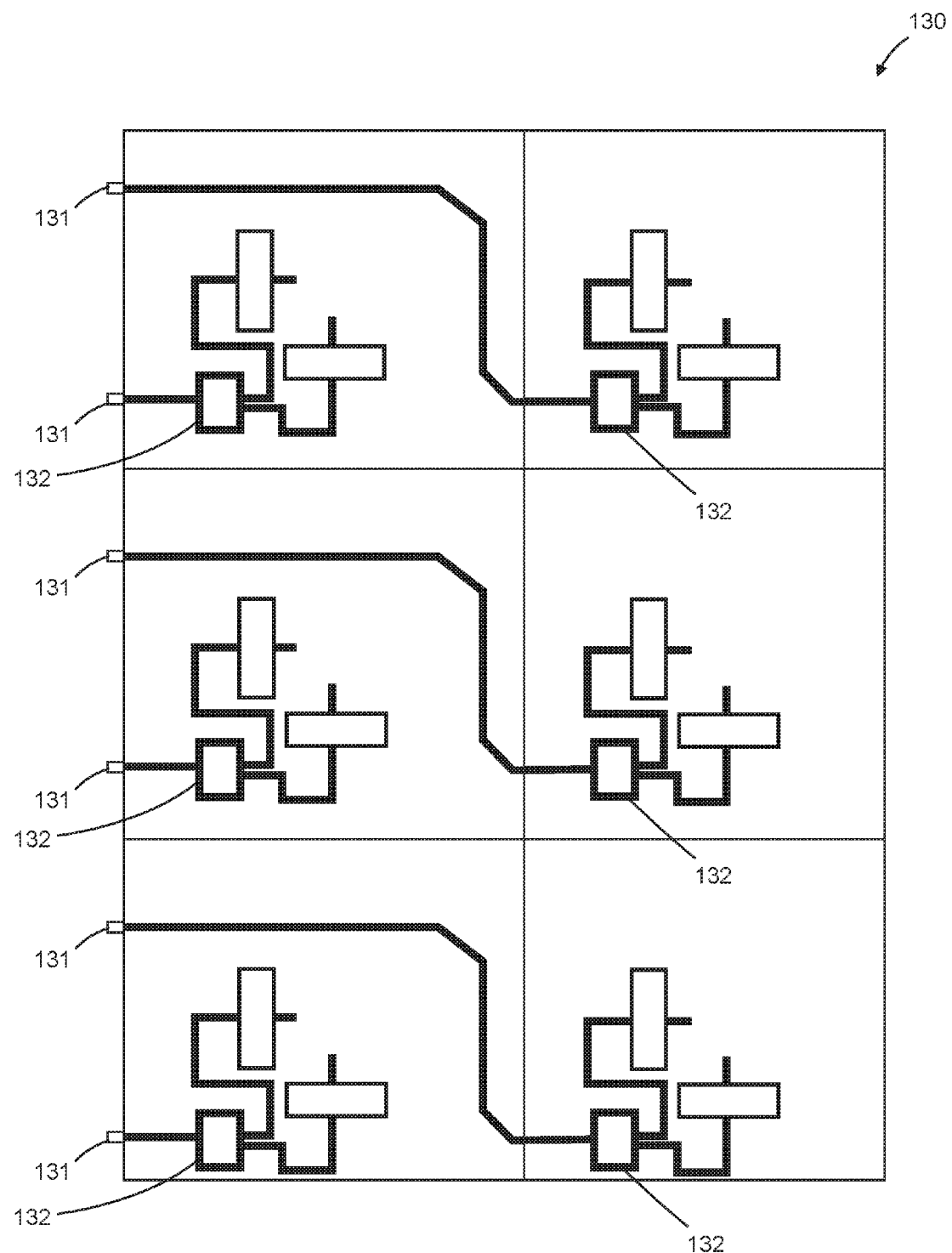
FIGS. 2A-2C illustrate an RFID antenna assembly, according to certain inventive techniques.
Figure 2B:
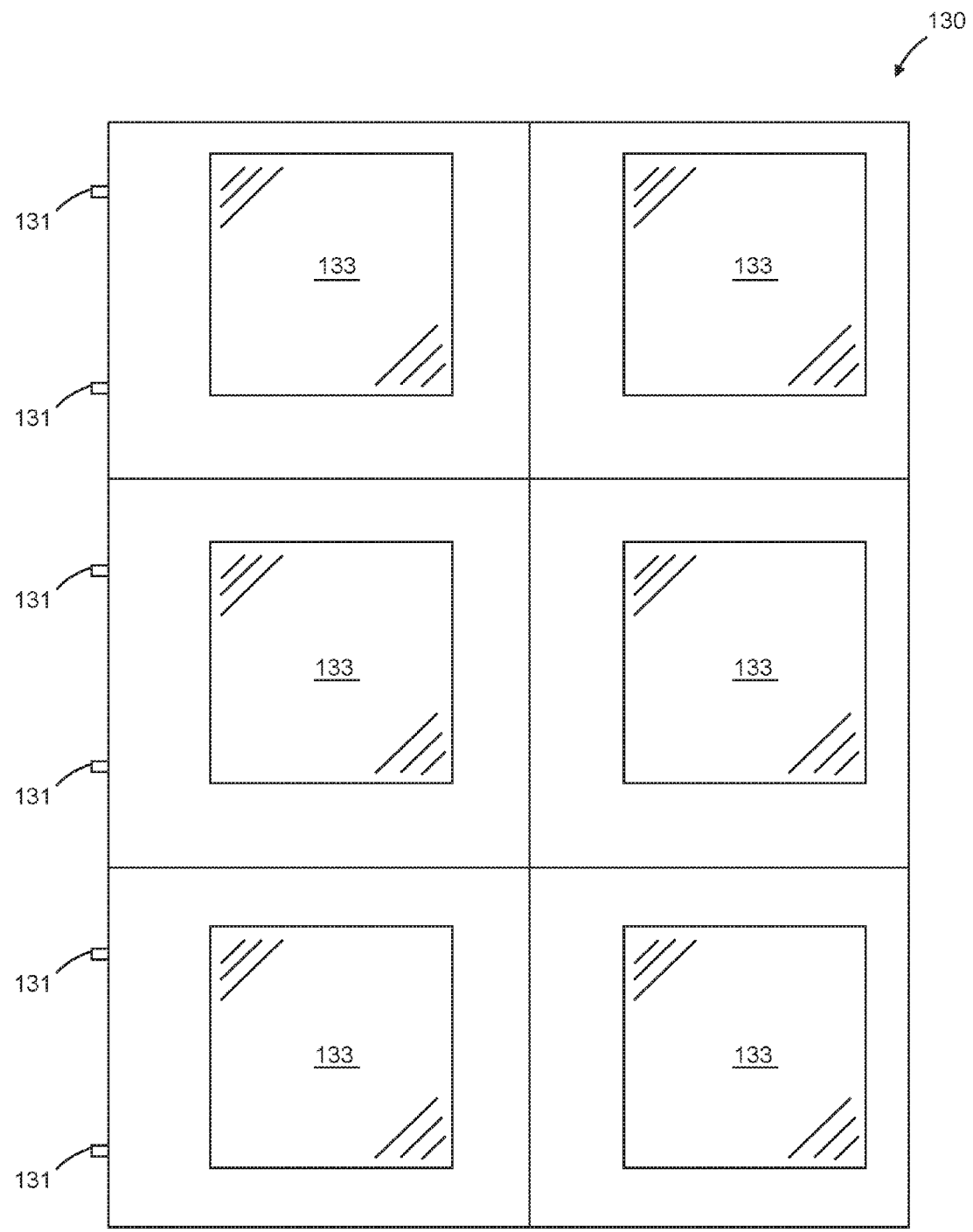

Referencing to FIGS. 2A and 2B, an RFID antenna assembly 130 of the present technology may also include a plurality of elements (six are shown, but it should be appreciated by those skilled in the art that more or less elements can be utilized in the RFID antenna assembly 130). Each element may include one or more RF connectors 131, one or more voltage dividers 132 (each of which may include one or more resistors), and one or more patches 133. Each element may include additional elements, such as solder or patches aside from patch 133. Patch 133 may refer, for example, to a rectilinear microstrip radiator or a resonant microstrip patch antenna. The connector 131 may be one suitable for connecting to a coaxial RF cable. The connector may be electrically connected to a voltage divider 132, which may incorporates one or more resistors. The connector 131 may be a "quick-connect" style connector known in the electrical arts for all RF cable connections rather than thread-on connectors. This may facilitate quicker assembly of the considerable number of RF cables needed for a large capacity unit (for example, in one embodiment of the present technology 24 connectors in several RFID antenna assembl(ies) 130 are envisaged, among others).

The antennas may be designed to be resonant at the center frequency of the RFID band in use (for example, 915 MHz). The antennas, furthermore, may be disposed in orthogonal polarizations to efficiently distribute RF energy throughout the enclosure. Arrays of antennas may also be used to assist in making the RF energy throughout the enclosure more uniform.

The RFID antenna assembly 130 of the present technology may be mounted inside a protective enclosure (for example, a clamshell-type enclosure). The enclosure (not shown) may provide for a number of functions. For example, the enclosure may protect the RFID antenna assembly 130 (for example, from moisture that enters the interior region of the cold-storage apparatus 110 when the door is opened); provide a stable mechanical mount, and/or be adapted to fit in a shelf-holding structure in the cold-storage apparatus 110. The RFID antenna assembly 130 may alternatively be sealed inside the enclosure (for example, a plastic enclosure) which, in turn, may engage with or mount to a shelf-holding structure within the cold-storage apparatus 110. According to at least one embodiment of the present technology, the RFID antenna assembly 130 is approximately 24 inches by approximately 18 inches.

The RFID antenna assembly 130 may also include one or more RFID antenna elements (for example, one to eight different discrete elements, or more). The RFID antenna elements may be arranged in a grid as shown or in another arrangement (for example, an irregular arrangement). The RFID antenna elements may be spaced apart from each other to reduce interference between the elements. For example, the spacing between antenna elements may be large enough to efficiently reduce inter-antenna interference (for example, as determined from electromagnetic simulations) and small enough to accommodate multiple antennas in the area of a ULT cold-storage apparatus shelf. The spacing dimensions between the elements may be based on antenna modeling calculations using a 915 MHz RF signal at −80° C. Modeling may be done with computer-based simulation tools available in the relevant art including EM by Sonnet Software (Syracuse, N.Y.), ADS by Agilent (Santa Clara, Calif.), and HFSS by Ansoft (Pittsburgh, Pa.).

Additionally, experiments may be conducted for specific freezer volumes and layouts to determine an effective number of antennas and shelves needed for reading all tagged articles in the compartment. Additionally, elements adjacent to a given element may be employed to tune the given element by providing constructive interference. Such constructive interference may aid in optimizing the RF characteristics of each element. One or more of the RFID antenna elements may be circularly polarized. Such polarization may reduce sensitivity to variations in location and/or orientation of one or more of the RFID tags. Dual-polarized antennas may also be used to provide two orthogonal polarizations. Also, the RFID antenna elements may be linearly polarized or single-polarized.

Using multiple elements rather than one larger element can provide certain advantages of the present technology. For example, by using multiple RF beams, there may be fewer or no RF null-spots (areas with no RF signal) in the interior space of the cold-storage apparatus 110. As another example, an array may be less susceptible to detuning effects (caused, for example, by temperature change). This can provide better performance of the cold storage apparatus 110 across a wider temperature range than a single element, or a fewer element RFID antenna assembly 130.

One or more mechanical tuning structures may also be included to allow one or more of the antenna elements to be adjusted for improved performance and consistency across the RFID antenna assembly 130. According to at least one technique of the present technology, tuning elements can be implemented by threaded stanchions for each RFID antenna element to adjust the thickness of the RFID antenna assembly 130. The mechanical tuning structures may tune the RFID antenna elements to effectively improve the antennas' reflection coefficients and consequent input impedance match. Tuning may also be performed with properly chosen electrical techniques such as single- or double-stub impedance matching networks.

Figure 2C:
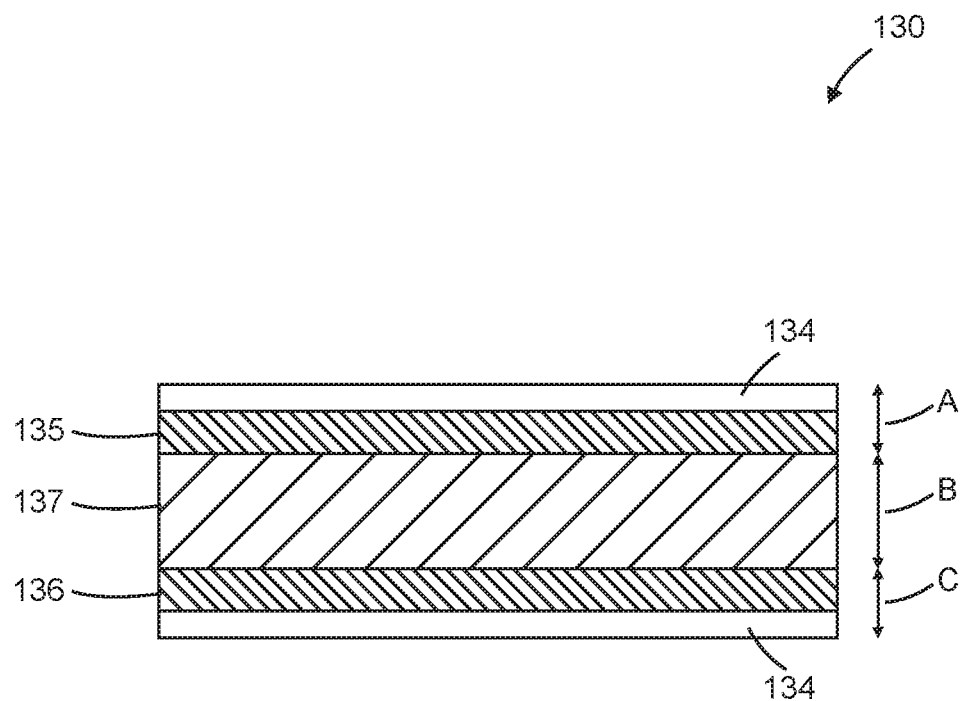

Referring to FIG. 2C, a cross-sectional view of the RFID antenna assembly 130 is shown. The RFID antenna assembly 130 may include, for example, at least one patterned conductive layer 134, a first dielectric region 135, a second dielectric region 136, and a third dielectric region 137. The patterned conductive layer 134 may include the resistor 132 and/or other trace components shown in FIG. 2A. The patterned conductive layer 134 may be formed of an electrically conductive material such as copper and/or electrically conductive solder, among others. It should be appreciated by those skilled in the art that other configurations are also envisaged using more or less layering schemas as described above.

The first dielectric region 135 may include, for example, at least one circuit board, such as one that comprises a glass-reinforced epoxy laminate sheet with a grade of FR-4. The first dielectric region 135 and the patterned conductive layer 134 may be integrated. For example, these two components (134, 135) may form a printed circuit board. As depicted in FIG. 2C, the first dielectric region 135 and the patterned conductive layer 134 may have a thickness A. Such a thickness may be approximately 1.575 mm. The thickness may be chosen, for example, to form a 50-Ohm characteristic impedance for the microstrip transmission line structures used in the antennas.

The second dielectric region 136 may also include, for example, at least one circuit board, such as one that comprises a glass-reinforced epoxy laminate sheet material made of FR-4. Teflon derivatives could also be used. The second dielectric region 136 and the patch 133 may be integrated. For example, these two components (133, 136) may form a printed circuit board. As depicted in FIG. 2C, the second dielectric region 136 and the patch 133 may have a thickness B. Such a thickness may be approximately 1.575 mm. The thickness may be chosen, for example, to form a 50-Ohm characteristic impedance for the microstrip transmission line structures used in the antennas. Thus, the discrete RFID antenna elements may be formed on two printed circuit boards.

The third dielectric region 137 may include, for example, at least one dielectric material. The dielectric constant for such a material may be between approximately about 1.00 to about 1.10. According to at least one technique of the present technology, the dielectric constant of the material in the third dielectric region 137 is preferably 1.03. Such a material may include foam, such as Cuming Microwave's PF-2 C-Foam. The third dielectric region 137 may also be formed using pems or standoffs (e.g., nylon pems or standoffs) to create an air gap between the circuits. In this configuration, the edges of the assembly 130 (or a portion thereof) could be sealed to prevent frost from entering the third dielectric region 137. As depicted in FIG. 2C, the third dielectric region 137 may have a thickness C. Such a thickness may be approximately 6.4 mm.

Thus, the RFID antenna assembly 130 in some embodiments and aspects of the present technology can utilize at least one laminated printed circuit board construction in combination with a low dielectric constant material in a way that the finished geometry of the RFID antenna elements can maintain performance in a −80° C., metal-lined environment. This design may account for the mechanical material changes that occur at −80° C. so that the antenna remains in tune once at operating temperature(s).

Figure 1B:
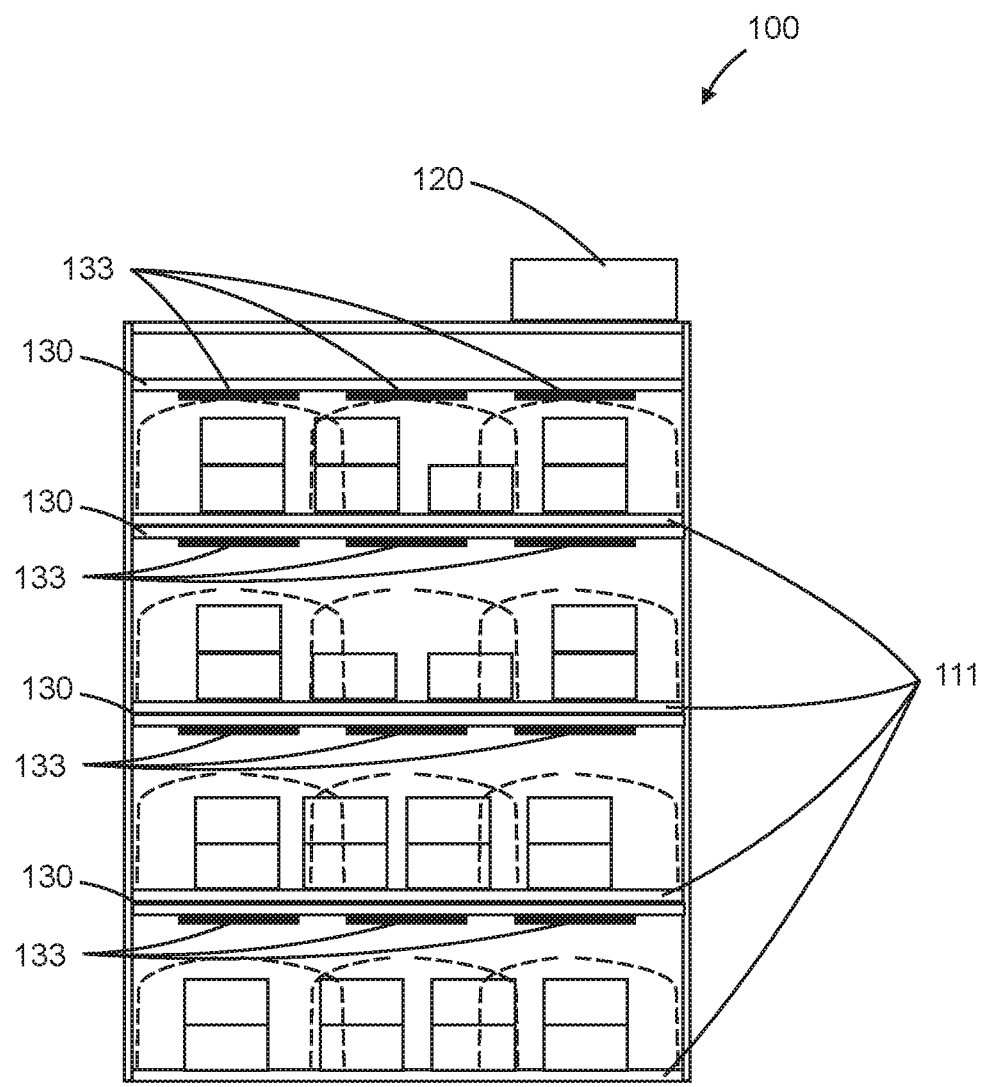
FIG. 1B illustrates a cross-sectional view of a system including a cold-storage apparatus, a controller, and an RFID antenna assembly, according to certain inventive techniques.

Referring to FIGS. 1A and 1B, each of the elements in the RFID antenna assembly 130 may be in communication with one or more controllers 120. For example, each of the antenna elements may be connected to the controller 120 via coaxial RF cables (not shown). The controller 120 may provide energy to the RFID antenna assembly 130, which may then be transmitted from one or more of the antenna elements. For example, the controller 120 may transmit radio frequency energy (for example, energy at approximately 915 MHz) to the antenna elements, which may then be transmitted by the antenna elements into the interior chamber of the cold storage apparatus 110 and towards the plurality of shelves 111. Such transmission of radio frequency energy is illustrated in FIG. 1B. The beam patterns shown in FIG. 1B are merely illustrative, and it is understood that a variety of different beam patterns may be formed according to design preferences. It should be appreciated by those skilled in the art that the RFID antenna assembly 130 of the present technology may be further improved, focused, or tuned for a given radio frequency by adjusting the antenna material thicknesses and printed circuit board conductor geometry to improve, focus, or tune the elements to specific frequency bands.

A given RFID tag on an item(s) 10 may receive the energy from the RFID antenna assembly 130 and responsively emit energy including item information back towards the RFID antenna assembly 130. One or more of the antenna elements may receive the item information, and this may be communicated back to the controller 120. The controller 120 may communicate the item information to a processing system (not shown) for further processing. The processing system may be in the same housing as the controller 120 or may be located separately within cold storage apparatus 110 or, alternatively, remotely to cold storage apparatus 110.

According to at least one technique of the present technology, only one antenna element of the RFID antenna assembly 130 will be active at a given time as controlled by a controller 120 during the scanning process. Thus, the controller 120 may be able to individually and separately control each of the antenna elements. Scanning through all antenna module elements simultaneously may produce unwanted background noise and an overload of RFID tag data. To overcome this, the scanning process may be logically separated by antenna elements. RFID energy is transmitted by only one antenna element while the other antenna elements are inactive. Item information may then be received by the active antenna element and communicated back to the controller 120. Then, that antenna element is made inactive and another antenna element is activated, and the process is repeated.

If there are more than one RFID antenna assemblies 130 in the cold-storage apparatus 110, then each antenna element of each RFID antenna assembly 130 may be connected to the controller 120. The controller 120 may effectuate scanning by activating only one antenna element of one assembly 130 at a time, similar to the manner discussed above.

Once all antenna elements have been activated, the resulting item information may be processed (either by the controller 120 or by another component not shown) to produce a "real-time" list of the inventory in the cold-storage apparatus 110.

The number of RFID antenna assemblies 130 needed in a given cold-storage apparatus 110 may depend on the number of products intended to be stored. According to at least one technique of the present technology, only one RFID antenna assembly 130 could be utilized and arranged to emit energy downwardly onto the items 10 on the shelves 111 in a "showerhead" type configuration. According to another technique of the present technology, an RFID antenna assembly 130 is arranged to project RFID energy upward and is located proximate the bottom of the interior region of the cold-storage apparatus 110. According to yet another technique of the present technology, one or more RFID antenna assemblies 130 may be above or below a number of shelves 111. According to still another technique of the present technology, one or more RFID antenna assemblies 130 may be vertically arranged (for example, parallel to the sides of the interior region of the cold storage apparatus 110) and may transmit energy in a more horizontal orientation. In addition to these techniques, it should be appreciated that any combination of the aforementioned RFID antenna assembly 130 orientations/placements can be implemented (for example, one RFID antenna assembly 130 may be located above the shelves 111 projecting downward, and one may be located below the shelves 111 projecting upward). A plurality of RFID antenna assemblies 130 may be arranged using a combination of the aforementioned arrangements.

Figure 3:
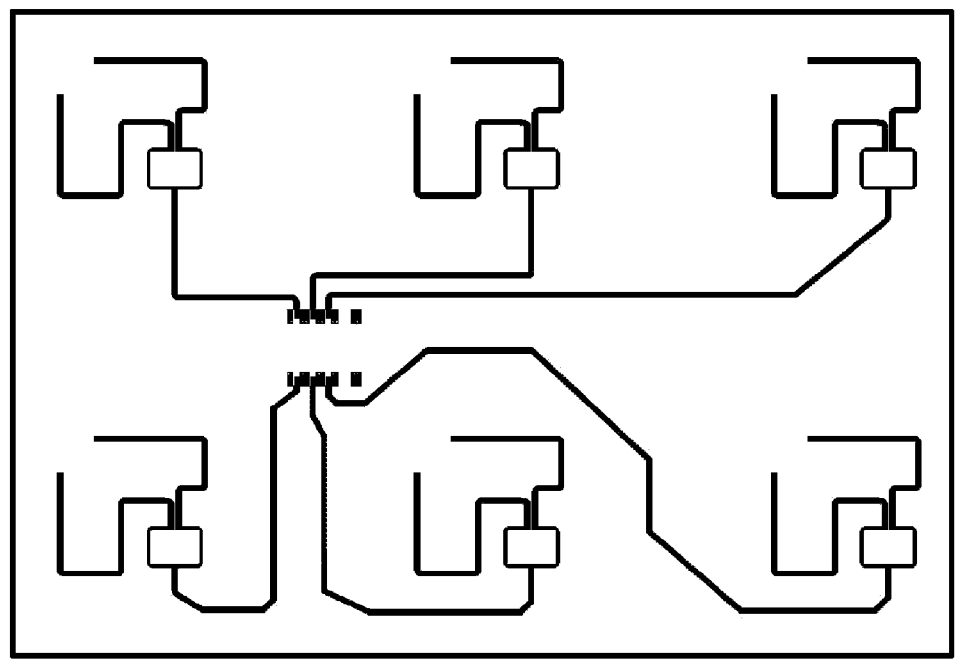
FIG. 3 illustrates an alternative embodiment of an RFID antenna assembly, according to certain inventive techniques.

According to another technique of the present technology, the RFID antenna assembly 130 includes one or more multiplexers. By this configuration, the number of RF energy transfer cables (for example, a coaxial RF cable) between the controller 120 and the RFID antenna assembly 130 would be less than the number of antenna elements in the RFID antenna assembly 130. A given multiplexer would selectively provide a connection from one energy transfer cable to a selected antenna element. The multiplexer may be controlled by a signal transmitted via the energy transfer cable or may be controlled through another signal separate from one transmitted by the energy transfer cable. According to a further technique of the present technology, the RFID antenna assembly 130 utilizes one RF energy transfer cable connection with the controller 120. The multiplexer is electrically connected to the cable and selectively activates the antenna elements in the RFID antenna assembly 130 one at a time according to its control signal. FIG. 3 illustrates one possible layout of an RFID antenna assembly that employs a multiplexer.

It will be understood by those skilled in the art that various changes may be made and equivalents may be substituted without departing from the scope of the novel techniques disclosed in this application. In addition, many modifications may be made to adapt a particular situation or material to the teachings of the novel techniques without departing from its scope. Therefore, it is intended that the novel techniques not be limited to the particular techniques disclosed, but that they will include all techniques falling within the scope of the appended claims.

The invention claimed is:
1. A system comprising:
a plurality of shelves at least partially within at least one interior chamber of a cold-storage apparatus, wherein each of the plurality of shelves is configured to support a plurality of items each attached to a radio-frequency identification ("RFID") tag;
at least one RFID antenna assembly located in the cold-storage apparatus, wherein the RFID antenna assembly includes a plurality of RFID antenna elements configured to direct a transmission of at least one radio frequency towards the plurality of shelves;
at least one controller in communication with the RFID antenna assembly, wherein the controller is configured to individually and separately control each of the plurality of RFID antenna elements;
wherein each of the plurality of RFID antenna elements comprises:
at least one patterned conductive layer;
at least one patch; and
at least one dielectric region interposed between the patterned conductive layer and the patch, wherein the dielectric region comprises at least one low dielectric constant foam, a first layer of glass-reinforced epoxy laminate interposed between the patterned conductive layer and the low dielectric constant foam, and a second layer of glass-reinforced epoxy laminate interposed between the patch and the low dielectric constant foam.

2. The system of claim 1, wherein the cold-storage apparatus is configured to store the plurality of items at a temperature between approximately minus 70° C. to approximately minus 90° C.

3. The system of claim 2, wherein the cold-storage apparatus is configured to store the plurality of items at a temperature of approximately minus 80° C.

4. The system of claim 1, wherein the controller is configured to activate only one of the plurality of RFID antenna elements at a time.

5. The system of claim 1, further comprising at least one processing system configured to receive data regarding scanned RFID tags on the plurality of items from the controller.

6. The system of claim 1, wherein each of the plurality of RFID antenna elements is at least one of: circularly polarized; linearly polarized; orthogonally polarized; or single-polarized.

7. The system of claim 1, further comprising a plurality of mechanical tuning structures configured to tune correspondingly one of each of the plurality of RFID antenna elements.

8. The system of claim 1, wherein there are six or more RFID antenna elements.

9. The system of claim 1, wherein the plurality of RFID antenna elements are formed on two printed circuit boards.

10. The system of claim 1, wherein the dielectric constant of the low dielectric constant foam is approximately between 1.00 to approximately 1.10.

11. The system of claim 10, wherein the dielectric constant of the low dielectric constant foam is approximately 1.03.

12. A system comprising:
at least one RFID antenna assembly for use in a cold-storage apparatus, wherein:
the RFID antenna assembly is configured to scan a plurality of RFID tags on a corresponding plurality of items; and
the RFID antenna assembly includes a plurality of individual RFID antenna elements, wherein the plurality of individual RFID antenna elements are formed on two printed circuit boards,
wherein each of the plurality of individual RFID antenna elements comprises at least one patterned conductive layer, at least one patch, and at least one dielectric region interposed between the patterned conductive layer and the patch, and
wherein the dielectric region comprises a low dielectric constant foam, a first layer of glass-reinforced epoxy laminate interposed between the patterned conductive layer and the low dielectric constant foam, and a second layer of glass-reinforced epoxy laminate interposed between the patch and the low dielectric constant foam; and
at least one controller in communication with the RFID antenna assembly, wherein the controller is configured to:
individually and separately control each of the plurality of individual RFID antenna elements; and
activate only one of the plurality of individual RFID antenna elements at a time.

13. The system of claim 12, wherein the RFID antenna assembly is configured to operate at a temperature between approximately minus 70° C. to approximately minus 90° C.

14. The system of claim 13, wherein the RFID antenna assembly is configured to operate at a temperature of approximately minus 80° C.

15. The system of claim 12, further comprising at least one processing system configured to receive data regarding scanned RFID tags on the plurality of items from the controller.

16. The system of claim 12, wherein each of the plurality of RFID antenna elements is at least one of: circularly polarized; linearly polarized; orthogonally polarized; or single-polarized.

17. The system of claim 12, further comprising a plurality of mechanical tuning structures configured to tune individual RFID antenna elements.

* * * * *